United States Patent
Zeng et al.

(10) Patent No.: US 11,049,915 B2
(45) Date of Patent: Jun. 29, 2021

(54) DISPLAY PANEL AND INTELLIGENT TERMINAL

(71) Applicant: Wuhan China Star Optoelectronics Semiconductor Display Technology Co., Ltd., Wuhan (CN)

(72) Inventors: Mian Zeng, Wuhan (CN); Liang Sun, Wuhan (CN); Shoucheng Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 89 days.

(21) Appl. No.: 16/492,134

(22) PCT Filed: Apr. 11, 2019

(86) PCT No.: PCT/CN2019/082221
§ 371 (c)(1),
(2) Date: Sep. 8, 2019

(87) PCT Pub. No.: WO2020/133801
PCT Pub. Date: Jul. 2, 2020

(65) Prior Publication Data
US 2020/0258915 A1    Aug. 13, 2020

(30) Foreign Application Priority Data
Dec. 27, 2018 (CN) .......................... 201811614379.X

(51) Int. Cl.
*H01L 27/32* (2006.01)
*H01L 27/12* (2006.01)
*G06K 9/00* (2006.01)
*H01L 27/15* (2006.01)

(52) U.S. Cl.
CPC ........ *H01L 27/3234* (2013.01); *G06K 9/0004* (2013.01); *H01L 27/1222* (2013.01); *H01L 27/1248* (2013.01); *H01L 27/156* (2013.01); *G09G 2360/144* (2013.01); *H01L 27/3246* (2013.01); *H01L 27/3272* (2013.01)

(58) Field of Classification Search
CPC ............. H01L 27/3234; H01L 27/1222; H01L 27/1248; H01L 27/3246; H01L 27/3295; H01L 27/3272
See application file for complete search history.

(56) References Cited

U.S. PATENT DOCUMENTS

| | | | |
|---|---|---|---|
| 7,839,081 B2* | 11/2010 | Kubota | H01L 51/5262 313/506 |
| 8,643,270 B2* | 2/2014 | Yamazaki | H01L 51/5088 313/509 |
| 9,166,193 B2* | 10/2015 | Akagawa | H01L 51/5253 |

(Continued)

*Primary Examiner* — Ida M Soward

(57) ABSTRACT

A display panel and an intelligent terminal are provided. The display panel includes a plurality of light-emitting zones and a plurality of light-transmitting zones. Each of the light-emitting zones includes a substrate, a thin-film transistor layer disposed on the substrate, a pixel defining layer disposed on the thin-film transistor layer, and a light-emitting layer disposed on the pixel defining layer. Each of the light-emitting zones includes a light-shielding layer, wherein the light-shielding layer is disposed in the substrate and/or disposed between the substrate and the light-emitting layer.

18 Claims, 3 Drawing Sheets

(56) References Cited

U.S. PATENT DOCUMENTS

| | | | |
|---|---|---|---|
| 9,312,323 B2* | 4/2016 | Yamazaki | H01L 27/3279 |
| 10,339,359 B2* | 7/2019 | Zhang | G06K 9/2027 |
| 10,691,913 B2* | 6/2020 | Chai | G06K 9/2036 |
| 2019/0123298 A1* | 4/2019 | Kanaya | H01L 29/78666 |
| 2019/0393387 A1* | 12/2019 | Kwon | H01L 27/15 |

* cited by examiner

DISPLAY PANEL AND INTELLIGENT TERMINAL

RELATED APPLICATIONS

This application is a National Phase of PCT Patent Application No. PCT/CN2019/082221 having International filing date of Apr. 11, 2019, which claims the benefit of priority of Chinese Patent Application No. 201811614379.X filed on Dec. 27, 2018. The contents of the above applications are all incorporated by reference as if fully set forth herein in their entirety.

FIELD AND BACKGROUND OF THE INVENTION

The present invention is related to a field of electronic display, and specifically to a display panel and an intelligent terminal.

Following the popularization of mobile devices and the development of the technology of display screens, the functions of the display screen are increased. In the display panel of the present mobile device, there is a camera set separately from the display screen. The screen-to-body ratio of the mobile device cannot further increase due to that the camera occupies an area of the display screen of the mobile devices. The camera is an indispensable part of the mobile device. How to integrate the camera and the display screen together thereby to maximize the screen-to-body ratio becomes a problem that need to be fixed quickly.

SUMMARY OF THE INVENTION

The prior art normally sets the camera of the mobile device outside the display screen. The display panel requires a predetermined space to place the camera therein. As a result, the display panel needs to define a notch to place the camera therein, and the area of the notch cannot be used as usual for displaying the content.

The present invention provides a display panel and an intelligent terminal. A light-emitting zone of the display panel has a light-shielding layer to avoid the light in the display panel from entering a light-transmitting zone and interfering with a light sensor.

To solve the problem above, the present invention provides a display panel, comprising:

a plurality of light-emitting zones, each of the light-emitting zones comprising a substrate, a thin-film transistor layer disposed on the substrate, a pixel defining layer disposed on the thin-film transistor layer, and a light-emitting layer disposed on the pixel defining layer; and a plurality of light-transmitting zones;

wherein each of the light-emitting zones comprises a light-shielding layer, the light-shielding layer is disposed in the substrate and/or disposed between the substrate and the light-emitting layer;

wherein a projected area of the light-shielding layer in a horizontal plane is greater than or equal to a projected area of each of the light-emitting zones in the horizontal plane; and wherein the light-emitting zones and the light-transmitting zones are alternated with each other.

According to the present invention, wherein the projected area of the light-shielding layer in the horizontal plane entirely covers a non-light-transmitting zone of the display panel, and the non-light-transmitting zone is a zone outside each of the light-transmitting zones of the display panel.

According to the present invention, wherein the light-shielding layer is disposed in the substrate;

wherein the substrate comprises a first buffer layer, the light-shielding layer is disposed on the first buffer layer, and a second buffer layer is disposed on the light-shielding layer; and wherein the material of the light-shielding layer is light-shielding metal.

The present invention provides a display panel, comprising:

a plurality of light-emitting zones, each of the light-emitting zones comprising a substrate, a thin-film transistor layer disposed on the substrate, a pixel defining layer disposed on the thin-film transistor layer, and a light-emitting layer disposed on the pixel defining layer; and a plurality of light-transmitting zones;

wherein each of the light-emitting zones comprises a light-shielding layer, and the light-shielding layer is disposed in the substrate and/or disposed between the substrate and the light-emitting layer.

According to the present invention, wherein a projected area of the light-shielding layer in a horizontal plane is greater than or equal to a projected area of each of the light-emitting zones in the horizontal plane.

According to the present invention, wherein the projected area of the light-shielding layer in the horizontal plane entirely covers a non-light-transmitting zone of the display panel, and the non-light-transmitting zone is a zone outside each of the light-transmitting zones of the display panel.

According to the present invention, wherein the light-emitting zones and the light-transmitting zones are alternated with each other.

According to the present invention, wherein the light-shielding layer is disposed in the substrate; and wherein the substrate comprises a first buffer layer, the light-shielding layer is disposed on the first buffer layer, and a second buffer layer is disposed on the light-shielding layer.

According to the present invention, wherein the material of the light-shielding layer is light-shielding metal.

According to the present invention, wherein the thin-film transistor layer comprises:

an active region, the active region comprising a channel region, and a drain region disposed on both sides of the channel region;

a gate dielectric layer covering the active region;

a gate metal layer disposed on the gate dielectric layer, and a projected area of the gate metal layer in a vertical plane covering the channel region;

an interlayer dielectric layer covering the active region;

a drain metal layer extending through the interlayer dielectric layer and electrically connected to the drain region;

a planarization layer covering the interlayer dielectric layer and the drain metal layer; and an electrode layer extending through the planarization layer and electrically connected to the drain metal layer;

wherein the light-shielding layer is disposed in any one of the substrate, the gate dielectric layer, the interlayer dielectric layer, the planarization layer, and the electrode layer, or the light-shielding layer is disposed between any neighboring two of the substrate, the gate dielectric layer, the interlayer dielectric layer, the planarization layer, and the electrode layer.

According to the present invention, wherein the light-shielding layer is any one of the planarization layer, the gate dielectric layer, and the interlayer dielectric layer; and wherein the material of the light-shielding layer is a light-shielding and electrically insulating material.

According to the present invention, wherein the light-shielding layer is the pixel defining layer; and wherein the material of the pixel defining layer is a light-shielding and electrically insulating material.

According to the present invention, wherein each of the light-emitting zones comprises the electrode layer disposed between the pixel defining layer and the light-emitting layer;

wherein the electrode layer and the pixel defining layer form the light-shielding layer; and wherein the material of the electrode layer is a light-shielding metal, and the material of the pixel defining layer is a light-shielding and electrically insulating material.

According to the present invention, wherein each of the light-transmitting zones comprises:

a light-transmitting substrate, and the light-transmitting substrate formed by an extension of the substrate of each of the light-emitting zones neighboring each of the light-emitting zones; and an electrically insulating, laminated layer, and the electrically insulating, laminated layer formed by an extension of an electrically insulating layer of the thin-film transistor layer of each of the light-emitting zones neighboring each of the light-transmitting zones.

According to the present invention, wherein the plurality of light-transmitting zones and the plurality of light-emitting zones that neighbor the plurality of light-transmitting zones form a first functional zone;

wherein the first functional zone implements a display function through the light-emitting zones of the first functional zone;

wherein the first functional zone implements a light conduction function through the light-transmitting zones of the first functional zone;

wherein the light-emitting zones not neighboring the light-transmitting zones form a second functional zone; and wherein the second functional zone implements the display function through the light-emitting zones of the second functional zone.

According to the present invention, wherein an area of the first functional zone is less than or equal to an area of the display panel, and an area of the second functional zone is less than the area of the display panel.

Correspondingly, the present invention further provides an intelligent terminal, comprising:

a display panel, the display panel comprising a plurality of light-emitting zones and a plurality of light-transmitting zones; and a light sensor disposed under the display panel;

wherein each of the light-emitting zones comprises a substrate, a thin-film transistor layer disposed on the substrate, a pixel defining layer disposed on the thin-film transistor layer, and a light-emitting layer disposed on the pixel defining layer;

wherein each of the light-emitting zones comprises a light-shielding layer, and the light-shielding layer is disposed in the substrate and/or disposed between the substrate and the light-emitting layer; and wherein the light sensor having at least one light-emitting zone.

According to the present invention, wherein the plurality of light-transmitting zones and the plurality of light-emitting zones that neighbor the plurality of light-transmitting zones form a first functional zone;

wherein the first functional zone implements a display function through the light-emitting zones of the first functional zone;

wherein the first functional zone implements a light conduction function through the light-transmitting zones of the first functional zone;

wherein the light-emitting zones not neighboring the light-transmitting zones form a second functional zone;

wherein the second functional zone implements the display function through the light-emitting zones of the second functional zone; and wherein the light sensor is disposed under the first functional zone.

According to the present invention, wherein the number of the light sensors is greater than or equal to two, and multiple light sensors form a lens.

According to the present invention, wherein the number of the light sensors is greater than or equal to two, and multiple light sensors form a fingerprint identification unit.

The present invention provides a display panel includes a plurality of light-emitting zones and a plurality of light-transmitting zones. It can let the light pass through the display panel from the outside of the display panel and arrive at the light sensor under the display panel, and it does not affect the display function of the display panel. The light-emitting zone has a light-shielding layer. The light-shielding layer can avoid the light in the display panel enter the light-transmitting zone and affects the light sensor.

DESCRIPTION OF SPECIFIC EMBODIMENTS OF THE INVENTION

Figure 1:
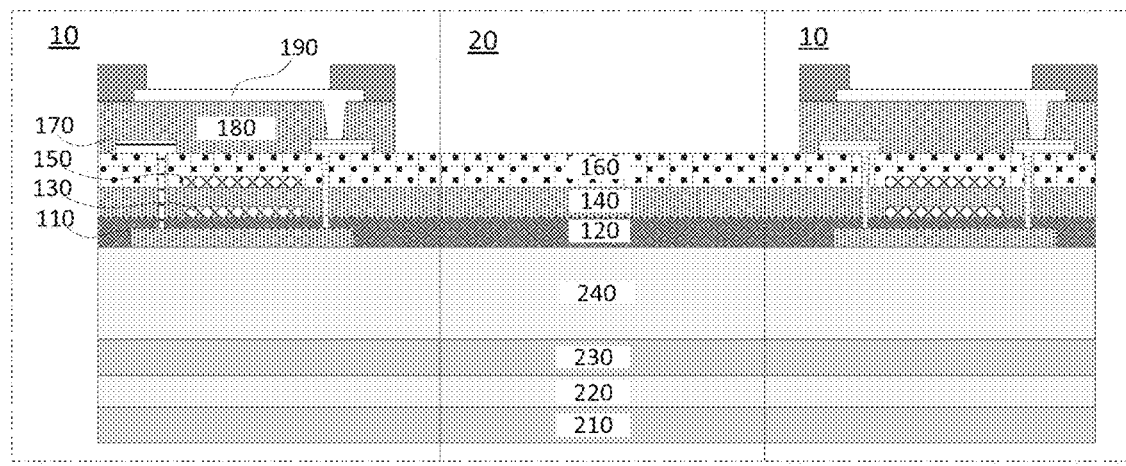
FIG. 1 is a partial structure diagram of the display panel of the prior art.

Examples are described below with reference to the appended drawings, to exemplify a particular embodiment of the invention each of the embodiments of the present embodiment. Directional terms mentioned in the present invention, such as "upper", "lower", "front", "rear", "left", "right", "top", "bottom", "horizontal", "vertical", etc., only reference to the accompanying drawings direction. Thus, the use of directional terms is used to describe and understand the present invention, not to limit the present invention. In the drawings, units of similar structure are using the same numeral to represent.

A brief description of the prior art is given first. Refer to FIG. 1, which is a partial structure diagram of the display panel of the prior art. A thin-film transistor layer 1 includes a plurality of thin-film transistor units 10 each having the same structure and a plurality of light-transmitting units 20 each having the same structure. The thin-film transistors and the light-transmitting units are alternated with each other.

In the prior art, refer to FIG. 1, the thin-film transistor unit 10 close to the light-transmitting unit 20. Accordingly, the light from the light-emitting material on the thin-film transistor unit 10 is easy to enter the light-transmitting zone 20.

Accordingly, a lot of interfering light enters the camera under the light-transmitting zone 20, whereby the imaging effect of the camera has been badly affected.

Therefore, the present invention provides a display panel and an intelligent terminal. A light-emitting zone of the display panel has a light-shielding layer to avoid the light in the display panel from entering a light-transmitting zone and interfering with a light sensor.

Figure 2:
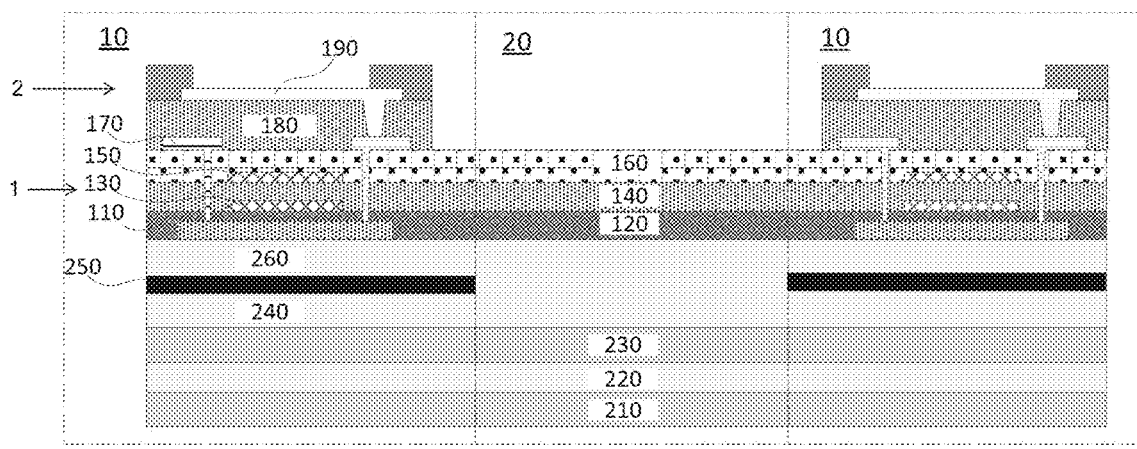
FIG. 2, FIG. 3, FIG. 4, FIG. 5 and FIG. 6 are partial structure diagrams of different embodiments of the present invention.

Specifically, refer to FIG. 2, which is a partial structure diagram of the display panel of an embodiment of the present invention. The display panel includes a plurality of light-emitting zones 10 and a plurality of light-transmitting zones 20. Each of the light-emitting zones 10 includes a substrate, a thin-film transistor layer 1 disposed on the substrate, a pixel defining layer 2 disposed on the thin-film transistor layer 1, and a light-emitting layer disposed on the pixel defining layer 2. Each of the light-emitting zones 10 includes a light-shielding layer, and the light-shielding layer is disposed in the substrate and/or disposed between the substrate and the light-emitting layer.

In this embodiment, the light-emitting zones 10 and the light-transmitting zones 20 are alternated with each other.

In this embodiment, the substrate includes a first isolation layer 210, a first buffer layer 220 disposed on the first isolation layer, a second isolation layer 230 disposed on the first buffer layer 220, and a second buffer layer 240 disposed on the second isolation layer. The material of the first isolation layer 210 and the second isolation layer 230 can be polyimide.

The thin-film transistor layer 1 includes an active region 110 disposed on the substrate. The active region 110 includes a channel region, and a drain region disposed on both sides of the channel region. A gate dielectric layer 120 covers the active region 110. A gate metal layer 130 is disposed on the gate dielectric layer 120. A projected area of the gate metal layer 130 in a vertical plane covers the channel region. An interlayer dielectric layer 160 covers the gate dielectric layer 120 and a gate metal. A drain metal layer 170 extends through the interlayer dielectric layer 160 and is electrically connected to the drain region. A planarization layer 180 covers the interlayer dielectric layer 160 and the drain metal layer 170.

In this embodiment, the pixel defining layer 2 includes an electrode layer 190 extending through the planarization layer 180 and electrically connected to the drain metal layer 170, and an insulation layer disposed on the planarization layer 180 and exposing the electrode layer 190.

In this embodiment, to enhance the effect of the gate control, the thin-film transistor layer 1 further includes a second gate insulation layer 140 disposed on the gate metal layer 130, a second gate metal layer 150 disposed on the second gate insulation layer 140, and an interlayer dielectric layer 160 covering the second gate insulation layer 140 and the second gate metal layer 150.

The light-transmitting unit 20 includes a first substrate including a first buffer layer 220 and a second buffer layer 240 disposed on the first buffer layer 220, a first dielectric layer covering the substrate, wherein the first dielectric layer is formed by an extension of the gate dielectric layer 120 of the thin-film transistor unit 10 neighboring the thin-film transistor unit 10, and a second dielectric layer covering the gate dielectric layer 120, wherein the second dielectric layer is formed by an extension of the interlayer dielectric layer 160 of the thin-film transistor unit 10 neighboring the thin-film transistor unit 10.

In this embodiment, the plurality of light-transmitting zones 20 and the plurality of light-emitting zones 10 that neighbor the plurality of light-transmitting zones 20 form a first functional zone. The first functional zone implements a display function through the light-emitting zones 10 of the first functional zone. The first functional zone implements a light conduction function through the light-transmitting zones 20 of the first functional zone. The light-emitting zones 10 not neighboring the light-transmitting zones 20 form a second functional zone. The second functional zone implements the display function through the light-emitting zones 10 of the second functional zone. An area of the first functional zone is less than or equal to an area of the display panel, and an area of the second functional zone is less than the area of the display panel.

In this embodiment, the light-shielding layer is disposed in the substrate. Specifically, the light-shielding layer 250 is disposed in the second buffer layer 240. Referring to FIG. 2, the second buffer layer 240 includes a first part 240, wherein the light-shielding layer 250 disposed on the first part 240, and a second part 260 disposed on the light-shielding layer 250. The light-shielding layer 250 can be positioned in any one of laminated structures of the substrate and includes but not limited to any one of buffer layers or any one of isolation layers.

In this embodiment, the material of the light-shielding layer 250 is light-shielding metal. A projected area of the light-shielding layer 250 in a horizontal plane is greater than or equal to a projected area of each of the light-emitting zones 10 in the horizontal plane.

In the other embodiment of the present invention, the thin-film transistor unit 10 includes a light-shielding layer. The light-shielding layer is disposed in any one of the substrate, the gate dielectric layer 120, the interlayer dielectric layer 160, the planarization layer 180, and the pixel defining layer 2, or the light-shielding layer is disposed between any neighboring two of the substrate, the gate dielectric layer, the interlayer dielectric layer, the planarization layer, and the pixel defining layer 2. In the second embodiment, the light-shielding layer is disposed in the substrate. Specifically, the light-shielding layer 250 is disposed in the second buffer layer 240. Referring to FIG. 2, the second buffer layer 240 includes a first part 240, wherein the light-shielding layer 250 is disposed on the first part 240, and a second part 260 disposed on the light-shielding layer 250. The light-shielding layer 250 can be disposed in any one of laminated structures of the substrate and includes but not limited to any one of buffer layers or any one of isolation layers.

In the other embodiment of the present invention, the material of the light-shielding layer 250 is light-shielding metal. A projected area of the light-shielding layer in a horizontal plane is greater than or equal to a projected area of the thin-film transistor unit 10 in the horizontal plane.

Figure 3:
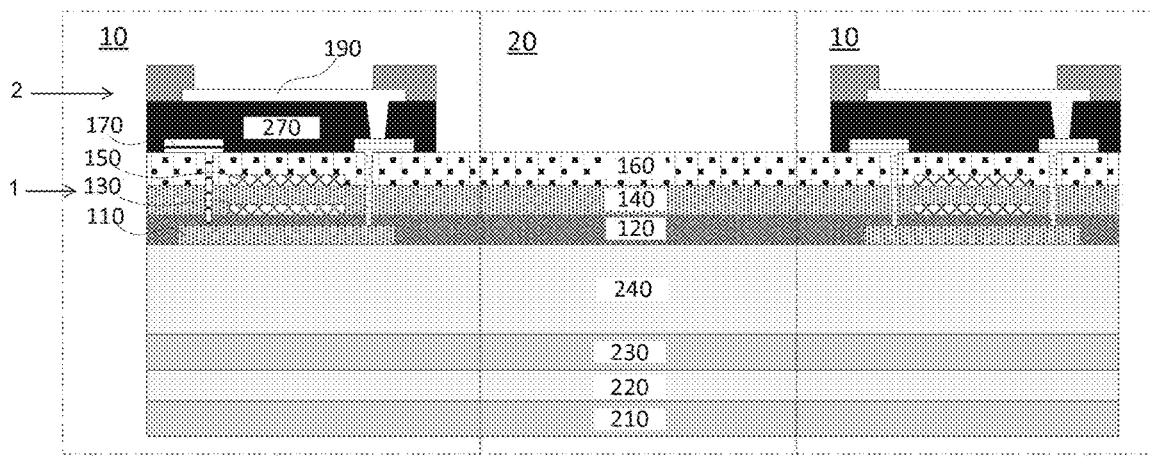

Refer to FIG. 3, which is a partial structure diagram of the display panel of the other embodiment of the present invention. In this embodiment, the light-shielding layer is the planarization layer 180, and the material of the planarization layer 180 is a light-shielding and electrically insulating material.

Figure 4:
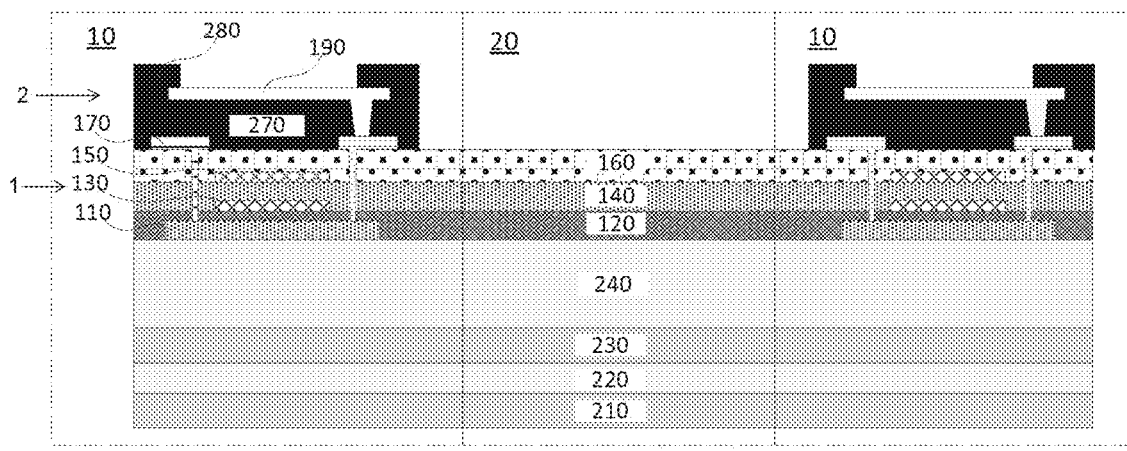

Refer to FIG. 4, which is a partial structure diagram of the display panel of the other embodiment of the present invention. In this embodiment, the thin-film transistor layer 1 includes a pixel defining layer 2 disposed on an electrode layer 190. The pixel defining layer 2 exposes a through-hole of the electrode layer 190. The material of the pixel defining layer 2 is a light-shielding and electrically insulating material, and the preferred light-shielding and electrically insulating material is black resin.

Figure 5:
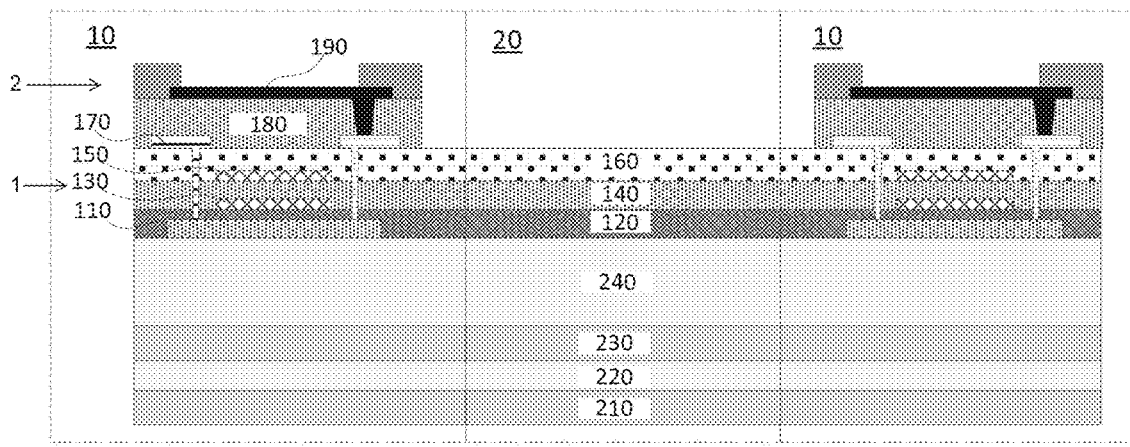

Refer to FIG. 5, which is a partial structure diagram of the display panel of the fourth embodiment of the present invention. In this embodiment, the light-shielding layer is the electrode layer 190. The material of the electrode layer 190 is light-shielding metal.

Figure 6:
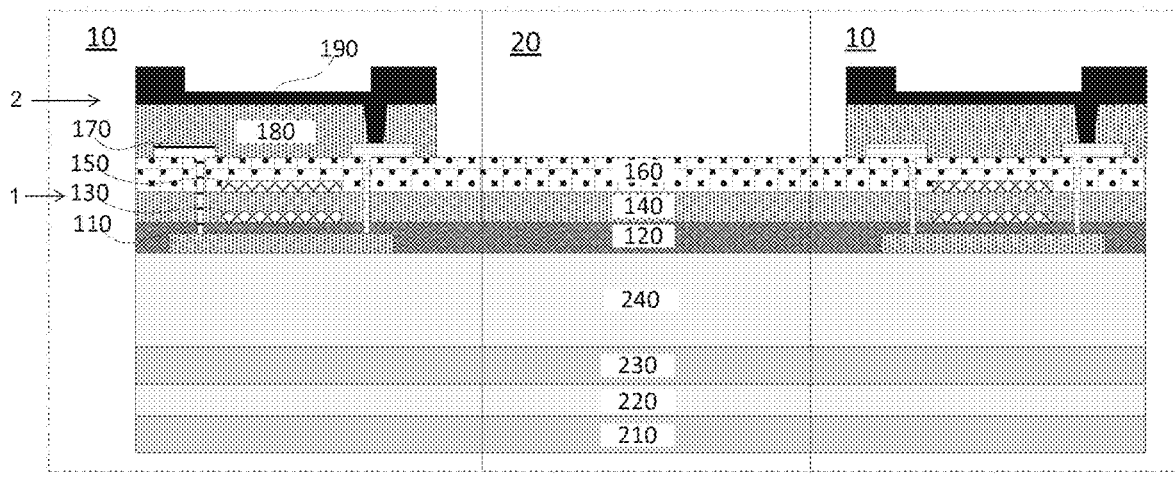

Refer to FIG. 6, which is a partial structure diagram of the display panel of the fifth embodiment of the present invention. In this embodiment, the thin-film transistor layer 1 includes an electrically insulating layer disposed on an electrode layer 190. The electrically insulating layer exposes a through-hole of the electrode layer 190. The material of the electrically insulating layer is a light-shielding and electrically insulating material, and the preferred light-shielding and electrically insulating material is black resin.

Figure 7:
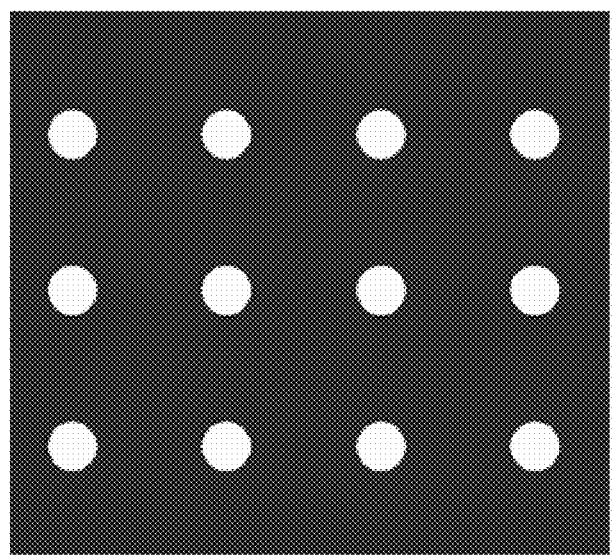
FIG. 7 is a first top view diagram of the display panel of embodiments of the present invention.

Preferably, refer to FIG. 7, which is a first top view diagram of the display panel of embodiments of the present invention. To better block the light generated by the display panel itself, the projected area of the light-shielding layer in the horizontal plane entirely covers a non-light-transmitting zone of the display panel, and the non-light-transmitting zone is a zone outside each of the light-transmitting zones of the display panel.

Figure 8:
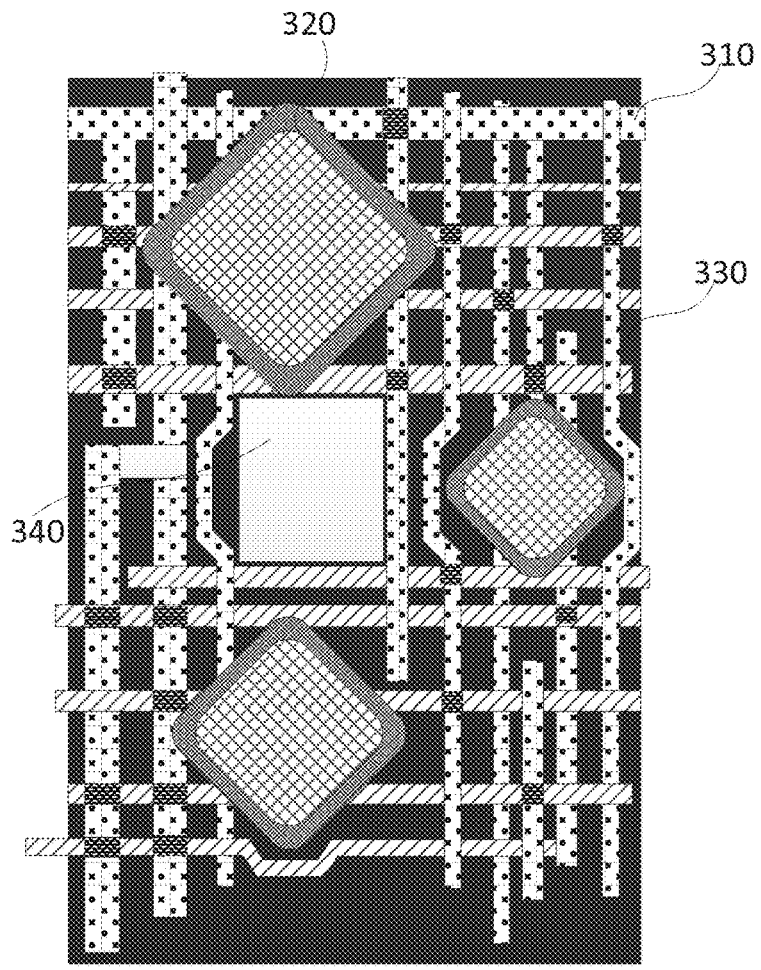
FIG. 8 is a second top view diagram of the display panel of embodiments of the present invention.

Specifically, refer to FIG. 8, which is a second top view diagram of the display panel of embodiments of the present invention. The display panel includes the light-emitting zone formed with a metal trace 310, a plurality of thin-film transistor units 320 and a light-shielding layer 330. A zone not covered by the metal trace 310, the plurality of thin-film transistor units 320 and the light-shielding layer 330 forms light-transmitting zone. The light-shielding layer 330 entirely covers an area outside the light-transmitting zone, to ensure the light inside the display panel does not interfere with the ambient light entering the display panel.

Correspondingly, the present invention further provides an intelligent terminal. The intelligent terminal includes a display panel. The display panel includes a plurality of light-emitting zones 10, a plurality of light-transmitting zones 20, and a light sensor disposed under the display panel. Each of the light-emitting zones 10 includes a substrate, a thin-film transistor layer 1 disposed on the substrate, a pixel defining layer 2 disposed on the thin-film transistor layer 1, and a light-emitting layer disposed on the pixel defining layer 2. Each of the light-emitting zones 10 includes a light-shielding layer, wherein the light-shielding layer is disposed in the substrate and/or disposed between the substrate and the light-emitting layer. There is at least one light-emitting zone 20 above the light sensor.

In this embodiment, the plurality of light-transmitting zones 20 and the plurality of light-emitting zones 10 that neighbor the plurality of light-transmitting zones 20 form a first functional zone. The first functional zone implements a display function through the light-emitting zones 10 of the first functional zone. The first functional zone implements a light conduction function through the light-transmitting zones 20 of the first functional zone. The light-emitting zones 10 not neighboring the light-transmitting zones 20 form a second functional zone. The second functional zone implements the display function through the light-emitting zones 10 of the second functional zone. The light sensor is disposed under the first functional zone.

Preferably, the number of the light sensors is greater than or equal to two, and multiple light sensors form a lens.

Preferably, the number of the light sensors is greater than or equal to two, and multiple light sensors form a fingerprint identification unit.

In this embodiment, the light-emitting zones 10 and the light-transmitting zones 20 are alternated with each other.

In this embodiment, the substrate includes a first isolation layer 210, a first buffer layer 220 disposed on the first isolation layer, a second isolation layer 230 disposed on the first buffer layer 220, and a second buffer layer 240 disposed on the second isolation layer. The material of the first isolation layer 210 and the second isolation layer 230 can be polyimide.

The thin-film transistor layer 1 includes an active region 110 disposed on the substrate. The active region 110 includes a channel region, and a drain region disposed on both sides of the channel region. A gate dielectric layer 120 covers the active region 110. A gate metal layer 130 is disposed on the gate dielectric layer 120. A projected area of the gate metal layer 130 in a vertical plane covers the channel region. An interlayer dielectric layer 160 covers the gate dielectric layer 120 and a gate metal. A drain metal layer 170 extending through the interlayer dielectric layer 160 and is electrically connected to the drain region. A planarization layer 180 covers the interlayer dielectric layer 160 and the drain metal layer 170.

In this embodiment, the pixel defining layer 2 includes an electrode layer 190 extending through the planarization layer 180 and electrically connected to the drain metal layer 170, and an insulation layer disposed on the planarization layer 180 and exposing the electrode layer 190.

In this embodiment, to enhance the effect of the gate control, the thin-film transistor layer 1 further includes a second gate insulation layer 140 disposed on the gate metal layer 130, a second gate metal layer 150 disposed on the second gate insulation layer 140, and an interlayer dielectric layer 160 covering the second gate insulation layer 140 and the second gate metal layer 150.

The light-transmitting unit 20 includes a first substrate including a first buffer layer 220 and a second buffer layer 240 disposed on the first buffer layer 220, a first dielectric layer covering the substrate, wherein the first dielectric layer is formed by an extension of the gate dielectric layer 120 of the thin-film transistor unit 10 neighboring the thin-film transistor unit 10, and a second dielectric layer covering the gate dielectric layer 120, the second dielectric layer is formed by an extension of the interlayer dielectric layer 160 of the thin-film transistor unit 10 neighboring the thin-film transistor unit 10.

In this embodiment, the plurality of light-transmitting zones 20 and the plurality of light-emitting zones 10 that neighbor the plurality of light-transmitting zones 20 form a first functional zone. The first functional zone implements a display function through the light-emitting zones 10 of the first functional zone. The first functional zone implements a light conduction function through the light-transmitting zones 20 of the first functional zone. The light-emitting zones 10 not neighboring the light-transmitting zones 20 form a second functional zone. The second functional zone implements the display function through the light-emitting zones 10 of the second functional zone. An area of the first functional zone is less than or equal to an area of the display panel, and an area of the second functional zone is less than the area of the display panel.

In this embodiment, the light-shielding layer is disposed in the substrate. Specifically, the light-shielding layer 250 is disposed in the second buffer layer 240. Referring to FIG. 2, the second buffer layer 240 includes a first part 240, wherein the light-shielding layer 250 disposed on the first part 240, and a second part 260 disposed on the light-shielding layer 250. The light-shielding layer 250 can be positioned in any one of laminated structures of the substrate and includes but not limited to any one of buffer layers or any one of isolation layers.

In this embodiment, the material of the light-shielding layer 250 is light-shielding metal. A projected area of the light-shielding layer 250 in a horizontal plane is greater than or equal to a projected area of each of the light-emitting zones 10 in the horizontal plane. Preferably, the projected area of the light-shielding layer 250 in the horizontal plane entirely covers a non-light-transmitting zone of the display panel, and the non-light-transmitting zone is a zone outside each of the light-transmitting zones of the display panel.

The thin-film transistor unit 10 includes a light-shielding layer. The light-shielding layer is disposed in any one of the substrate, the gate dielectric layer 120, the interlayer dielectric layer 160, the planarization layer 180, and the pixel defining layer 2, or the light-shielding layer is disposed between any neighboring two of the substrate, the gate dielectric layer, the interlayer dielectric layer, the planarization layer, and the pixel defining layer 2. In the second embodiment, the light-shielding layer is disposed in the substrate. Specifically, the light-shielding layer 250 is disposed in the second buffer layer 240. Referring to FIG. 2, the second buffer layer 240 includes a first part 240, wherein the light-shielding layer 250 is disposed on the first part 240, and a second part 260 disposed on the light-shielding layer 250. The light-shielding layer 250 can be disposed in any one of laminated structures of the substrate and includes but not limited to any one of buffer layers or any one of isolation layers.

In this embodiment, the material of the light-shielding layer 250 is light-shielding metal. A projected area of the light-shielding layer in a horizontal plane is greater than or equal to a projected area of the thin-film transistor unit 10 in the horizontal plane.

Refer to FIG. 3, which is a partial structure diagram of the display panel of the second embodiment of the present invention. In this embodiment, the light-shielding layer is the planarization layer 180, and the material of the planarization layer 180 is a light-shielding and electrically insulating material.

Refer to FIG. 4, which is a partial structure diagram of the display panel of the third embodiment of the present invention. In this embodiment, the thin-film transistor layer 1 includes a pixel defining layer 2 disposed on an electrode layer 190. The pixel defining layer 2 exposes a through-hole of the electrode layer 190. The material of the pixel defining layer 2 is a light-shielding and electrically insulating material.

In the second embodiment and the third embodiment, the light-shielding and electrically insulating material is black resin.

Refer to FIG. 5, which is a partial structure diagram of the display panel of the fourth embodiment of the present invention. In this embodiment, the light-shielding layer is the electrode layer 190. The material of the electrode layer 190 is light-shielding metal.

Refer to FIG. 6, which is a partial structure diagram of the display panel of the fifth embodiment of the present invention. In this embodiment, the thin-film transistor layer 1 includes an electrically insulating layer disposed on an electrode layer 190. The electrically insulating layer exposes a through-hole of the electrode layer 190. The material of the electrically insulating layer is a light-shielding and electrically insulating material, and the preferred light-shielding and electrically insulating material is black resin.

Preferably, refer to FIG. 7, which is a first top view diagram of the display panel of embodiments of the present invention. To better block the light generated by the display panel itself, the projected area of the light-shielding layer in the horizontal plane entirely covers a non-light-transmitting zone of the display panel, and the non-light-transmitting zone is a zone outside each of the light-transmitting zones of the display panel.

Specifically, refer to FIG. 8, which is a second top view diagram of the display panel of embodiments of the present invention. The display panel includes the light-emitting zone formed with a metal trace 310, a plurality of thin-film transistor units 320 and a light-shielding layer 330. A zone not covered by the metal trace 310, the plurality of thin-film transistor units 320 and the light-shielding layer 330 forms light-transmitting zone. The light-shielding layer 330 entirely covers an area outside the light-transmitting zone, to ensure the light inside the display panel does not interfere with the ambient light entering the display panel.

The present invention provides a display panel includes a plurality of light-emitting zones and a plurality of light-transmitting zones. It can let the light pass through the display panel from the outside of the display panel and arrive at the light sensor under the display panel, and it does not affect the display function of the display panel. The light-emitting zone has a light-shielding layer. The light-shielding layer can avoid the light in the display panel enter the light-transmitting zone and affects the light sensor.

Although the present invention has been disclosed above by the preferred embodiments, the preferred embodiments are not intended to limit the invention. One of ordinary skill in the art, without departing from the spirit and scope of the present invention, can make various modifications and variations of the present invention. Therefore, the scope of the claims to define the scope of equivalents.

What is claimed is:
1. A display panel, comprising:
a plurality of light-emitting zones, each of the light-emitting zones comprising a substrate, a thin-film transistor layer disposed on the substrate, and a pixel defining layer disposed on the thin-film transistor layer; and
a plurality of light-transmitting zones;
wherein each of the light-emitting zones further comprises a light-shielding layer, and the light-shielding layer is disposed in the substrate;
wherein a projected area of the light-shielding layer in a horizontal plane is greater than or equal to a projected area of each of the light-emitting zones in the horizontal plane; and
wherein the light-emitting zones and the light-transmitting zones are alternated with each other.

2. The display panel as claimed in claim 1, wherein the projected area of the light-shielding layer in the horizontal plane entirely covers a non-light-transmitting zone of the display panel, and the non-light-transmitting zone is a zone outside each of the light-transmitting zones of the display panel.

3. The display panel as claimed in claim 1, wherein the light-shielding layer is disposed in the substrate;
wherein the substrate comprises a first buffer layer, the light-shielding layer is disposed on the first buffer layer, and a second buffer layer is disposed on the light-shielding layer; and
wherein a material of the light-shielding layer is light-shielding metal.

4. A display panel, comprising:
  a plurality of light-emitting zones, each of the light-emitting zones comprising a substrate, a thin-film transistor layer disposed on the substrate, and a pixel defining layer disposed on the thin-film transistor layer; and
  a plurality of light-transmitting zones;
  wherein each of the light-emitting zones further comprises a light-shielding layer, and the light-shielding layer is disposed in the substrate.

5. The display panel as claimed in claim 4, wherein a projected area of the light-shielding layer in a horizontal plane is greater than or equal to a projected area of each of the light-emitting zones in the horizontal plane.

6. The display panel as claimed in claim 4, wherein a projected area of the light-shielding layer in a horizontal plane entirely covers a non-light-transmitting zone of the display panel, and the non-light-transmitting zone is a zone outside each of the light-transmitting zones of the display panel.

7. The display panel as claimed in claim 4, wherein the light-emitting zones and the light-transmitting zones are alternated with each other.

8. The display panel as claimed in claim 4, wherein the light-shielding layer is disposed in the substrate; and
  wherein the substrate comprises a first buffer layer, the light-shielding layer is disposed on the first buffer layer, and a second buffer layer is disposed on the light-shielding layer.

9. The display panel as claimed in claim 4, wherein a material of the light-shielding layer is light-shielding metal.

10. The display panel as claimed in claim 4, wherein the thin-film transistor layer comprises:
  an active region, the active region comprising a channel region, and a drain region disposed on both sides of the channel region;
  a gate dielectric layer covering the active region;
  a gate metal layer disposed on the gate dielectric layer, and a projected area of the gate metal layer in a vertical plane covering the channel region;
  an interlayer dielectric layer covering the active region;
  a drain metal layer extending through the interlayer dielectric layer and electrically connected to the drain region;
  a planarization layer covering the interlayer dielectric layer and the drain metal layer; and
  an electrode layer extending through the planarization layer and electrically connected to the drain metal layer;
  wherein the light-shielding layer is disposed in any one of the substrate, the gate dielectric layer, the interlayer dielectric layer, the planarization layer, and the electrode layer, or the light-shielding layer is disposed between any neighboring two of the substrate, the gate dielectric layer, the interlayer dielectric layer, the planarization layer, and the electrode layer.

11. The display panel as claimed in claim 10, wherein the light-shielding layer is any one of the planarization layer, the gate dielectric layer, and the interlayer dielectric layer; and
  wherein a material of the light-shielding layer is a light-shielding and electrically insulating material.

12. The display panel as claimed in claim 4, wherein the light-shielding layer is the pixel defining layer; and
  wherein a material of the pixel defining layer is a light-shielding and electrically insulating material.

13. The display panel as claimed in claim 4, wherein each of the light-emitting zones further comprises an electrode layer disposed on the pixel defining layer;
  wherein the electrode layer and the pixel defining layer form the light-shielding layer; and
  wherein a material of the electrode layer is a light-shielding metal, and a material of the pixel defining layer is a light-shielding and electrically insulating material.

14. The display panel as claimed in claim 4, wherein each of the light-transmitting zones comprises:
  a light-transmitting substrate, and the light-transmitting substrate formed by an extension of the substrate of each of the light-emitting zones neighboring each of the light-emitting zones; and
  an electrically insulating laminated layer, and the electrically insulating laminated layer formed by an extension of an electrically insulating layer of the thin-film transistor layer of each of the light-emitting zones neighboring each of the light-transmitting zones.

15. The display panel as claimed in claim 4, wherein the plurality of light-transmitting zones and the plurality of light-emitting zones that neighbor the plurality of light-transmitting zones form a first functional zone;
  wherein the first functional zone implements a display function through the light-emitting zones of the first functional zone;
  wherein the first functional zone implements a light conduction function through the light-transmitting zones of the first functional zone;
  wherein the light-emitting zones not neighboring the light-transmitting zones form a second functional zone; and
  wherein the second functional zone implements the display function through the light-emitting zones of the second functional zone.

16. The display panel as claimed in claim 15, wherein an area of the first functional zone is less than or equal to an area of the display panel, and an area of the second functional zone is less than the area of the display panel.

17. An intelligent terminal, comprising:
  a display panel, the display panel comprising a plurality of light-emitting zones and a plurality of light-transmitting zones;
  wherein each of the light-emitting zones comprises a substrate, a thin-film transistor layer disposed on the substrate, and a pixel defining layer disposed on the thin-film transistor layer; and
  wherein each of the light-emitting zones further comprises a light-shielding layer, and the light-shielding layer is disposed in the substrate.

18. The intelligent terminal as claimed in claim 17, wherein the plurality of light-transmitting zones and the plurality of light-emitting zones that neighbor the plurality of light-transmitting zones form a first functional zone;
  wherein the first functional zone implements a display function through the light-emitting zones of the first functional zone;
  wherein the first functional zone implements a light conduction function through the light-transmitting zones of the first functional zone;
  wherein the light-emitting zones not neighboring the light-transmitting zones form a second functional zone; and wherein the second functional zone implements the display function through the light-emitting zones of the second functional zone.

\* \* \* \* \*